United States Patent [19]

Sugisaka et al.

[11] Patent Number: 5,599,722
[45] Date of Patent: Feb. 4, 1997

[54] SOI SEMICONDUCTOR DEVICE AND METHOD OF PRODUCING SAME WHEREIN WARPAGE IS REDUCED IN THE SEMICONDUCTOR DEVICE

[75] Inventors: Takayuki Sugisaka, Okazaki; Shoji Miura, Nukata-gun; Toshio Sakakibara, Nishio, all of Japan

[73] Assignee: Nippondenso Co., Ltd., Kariya, Japan

[21] Appl. No.: 346,255

[22] Filed: Nov. 23, 1994

[30] Foreign Application Priority Data

Nov. 26, 1993 [JP] Japan .................... 5-296894

[51] Int. Cl.⁶ .......... H01L 21/265; H01L 21/02; H01L 21/302; H01L 21/76
[52] U.S. Cl. .............. 437/21; 437/62; 437/241
[58] Field of Search ............... 437/21, 62, 241, 437/86, 974

[56] References Cited

U.S. PATENT DOCUMENTS 5,296,385  3/1994  Moslehi et al. ................ 437/241

FOREIGN PATENT DOCUMENTS

| 0562127A1 | 9/1993 | European Pat. Off. . |
| 0562127 | 9/1993 | European Pat. Off. . |
| 1181438 | 7/1989 | Japan . |
| 1302740 | 12/1989 | Japan . |
| 3188648 | 8/1991 | Japan . |
| 5109882 | 4/1993 | Japan . |

*Primary Examiner*—Mary Wilczewski
*Assistant Examiner*—Brian K. Dutton
*Attorney, Agent, or Firm*—Cushman, Darby & Cushman IP Group of Pillsbury Madison & Sutro LLP

[57] ABSTRACT

A trench isolation junction type SOI semiconductor device which reduces substrate warpage while suppressing increase in production steps and a method for producing the same are disclosed. A junction substrate is formed by bonding a semiconductor substrate having an outer insulation film on a non-junction main surface with a semiconductor layer with an inner insulation film sandwiched therebetween. After forming a silicon nitride film as a mask for the purpose of forming a trench in the semiconductor layer, silicon nitride film accumulated on the outer insulation film is removed. By doing this, warpage of the semiconductor substrate due to discrepancies in the thermal expansion rates of the rigid silicon nitride film and semiconductor substrate can be prevented. In a junction type SOI semiconductor device formed via the method, an outer insulation film of identical thickness and identical density to an inner insulation film is formed on a non-junction main surface (i.e., rear surface) of a semiconductor substrate. By doing this, warpage of the semiconductor substrate can be prevented.

6 Claims, 6 Drawing Sheets

SOI SEMICONDUCTOR DEVICE AND METHOD OF PRODUCING SAME WHEREIN WARPAGE IS REDUCED IN THE SEMICONDUCTOR DEVICE

CROSS REFERENCE TO RELATED APPLICATION

This application is based upon and claims priority from Japanese Patent Application No. 5-296894 filed on Nov. 26, 1993, the contents of which are incorporated herein by reference.

BACKGROUND OF THE INVENTION

1. Field of the Invention

The present invention relates to an SOI (silicon-on-insulator) semiconductor device and a method of producing same. More particularly, the present invention relates to reducing warpage of an SOI semiconductor device.

2. Related Art

It is known to form an isolation trench in an SOI semiconductor device, bury this trench in polycrystalline silicon, and isolate between various elements. For example, such a structure and method is discussed in Japanese Patent Application Laid-open No. 5-109882.

In order to eliminate differences in levels occurring in the isolation trench when forming the isolation trench, an oxide film is formed on the semiconductor substrate. In addition, a silicon nitride film is formed above the trench before forming the isolation trench. Accordingly, oxide film for the formation of the isolation trench is required. Trench formation and oxidation of the trench inner wall surfaces and polycrystalline silicon burying are performed sequentially. The oxide film for isolation trench formation that remains on the substrate surface is removed with reactive ion etching (RIE).

Currently, the silicon nitride film functions such that oxide film formed on the trench inner walls is not simultaneously removed when the oxide film used for isolation trench formation is removed. Thus, the occurrence of differences between the levels in the isolation trench portion is prevented.

However, when the above-described semiconductor device is actually formed, the silicon nitride film is also deposited on the rear surface of the substrate. Although this nitride film deposited on the rear surface can be expected to prevent the penetration of undesirable contaminants from the substrate's rear surface side, the present inventors have found that the SOI substrate is warped by the internal stress of the nitride film itself when a trench is formed on the SOI substrate. This warpage of the substrate not only causes undesirable crystalline defects in a region where semiconductor elements are formed, but also hinders good formation of uniform elements within the wafer during element formation.

SUMMARY OF THE INVENTION

In view of the problem with known devices, it is an object of the present invention to provide a semiconductor device with an SOI structure having an isolation trench region while suppressing warpage of the substrate.

A method of producing an SOI semiconductor device according to the present invention includes joining a semiconductor substrate (for use as a base) having an outer insulation film on the main surface opposite to a junction surface side thereof to a semiconductor layer with an inner insulation film sandwiched therebetween. A nitride film as a mask for trench is formed formation on a surface of the semiconductor layer. A nitride film accumulated on the outer insulation film during a nitride film formation. The nitride film on the semiconductor layer is used as a mask to make a trench in the semiconductor layer. A filler material is provided to fill in the trench, thereby forming an island semiconductor region. Further, it is also acceptable to remove the filler material accumulated on the outer insulation film and subsequently form elements in the island semiconductor region.

The outer insulation film and the inner insulation film are formed from identical materials have identical thicknesses, and are composed, for example, of silicon oxide film. The outer insulation film and the inner insulation film are formed in the semiconductor substrate in an identical step prior to joining the semiconductor substrate and semiconductor layer.

Moreover, it is acceptable to use the nitride film as a portion of a mask for trench (isolation groove) formation, and it is possible to form on the nitride film a further mask of oxide film or the like by, for example, chemical vapor deposition.

In the method of production according to the present invention, in a joined substrate made by joining a semiconductor substrate having an outer insulation film on a main side, which is not a junction surface side, with a semiconductor layer and having an inner insulation film sandwiched therebetween, after forming a silicon nitride film as a mask for forming a trench in the semiconductor layer, silicon nitride film accumulated on the outer insulation film is removed.

When produces in this manner, although removing silicon nitride film on the outer insulation film is performed, warpage of the semiconductor substrate due to discrepancies in thermal expansion rates of the rigid silicon nitride film and semiconductor substrate can be prevented.

Polycrystalline silicon accumulated on the outer insulation film during polycrystalline silicon burying is also removed after trench burying. When done in this manner, on both main surfaces of the semiconductor substrate, only the inner insulation film and the outer insulation film initially formed, remain and by combining the thickness and material of these two films, warpage between the semiconductor substrate and the two insulation films can be balanced simply, and warpage can easily be reduced.

Additionally, the outer insulation film and the inner insulation film are composed of silicon oxide film formed from identical materials to identical thicknesses. When done in this manner, stresses between the two silicon oxide films and the semiconductor substrate are mutually offset, and moreover, because it is possible to form these silicon oxide films easily in an identical step, the method of production is simplified.

BRIEF DESCRIPTION OF THE DRAWINGS

Other objects, features and characteristics of the present invention will become apparent to those of ordinary skill in the art from studying the following detailed description, drawings and claims, all of which form a part of this application. In the drawings:

DETAILED DESCRIPTION OF THE PRESENTLY PREFERRED EMBODIMENTS

The present invention will be described with reference to the drawings.

Figure 1:
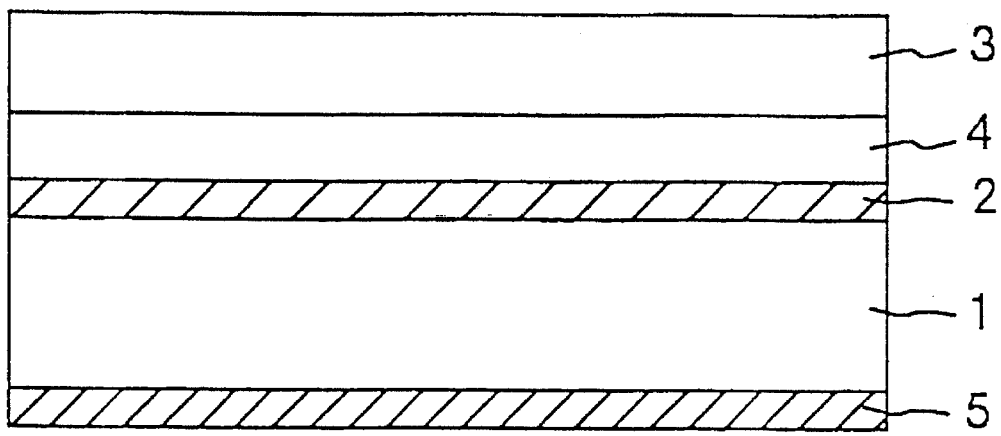
FIG. 1 is a sectional view of a production step of an SOI substrate according to a first embodiment of the present invention.

After one main face of a P⁻ type No. 1 monocrystalline silicon substrate 1 is mirror polished, thermal oxidation is performed and insulation films (silicon oxide films) 2 and 5 of identical thicknesses are formed. Thereafter, on insulation film 2 side of No. 1 silicon substrate 1 surface, No. 2 monocrystalline silicon substrate 3 having a mirror-polished main surface is sealed and heated in a sufficiently clean atmosphere, and respective silicon substrates 1 and 3 are bonded directly so as to sandwich insulation film 2. By means of this, an SOI substrate structured by bonding No. 2 silicon substrate 3 to No. 1 silicon substrate 1 via insulation film 2 is produced (see FIG. 1). Furthermore, in FIG. 1, numeral 4 identifies an N type high-concentration doping (antimony) layer formed by means of doping from the surface of No. 2 N⁻ type silicon substrate 3 before performing bonding. Consequently, N⁻ type silicon substrate 3 and N type high-concentration doping (antimony) layer 4 constitute the "semiconductor layer" according to the present invention.

Figure 2:
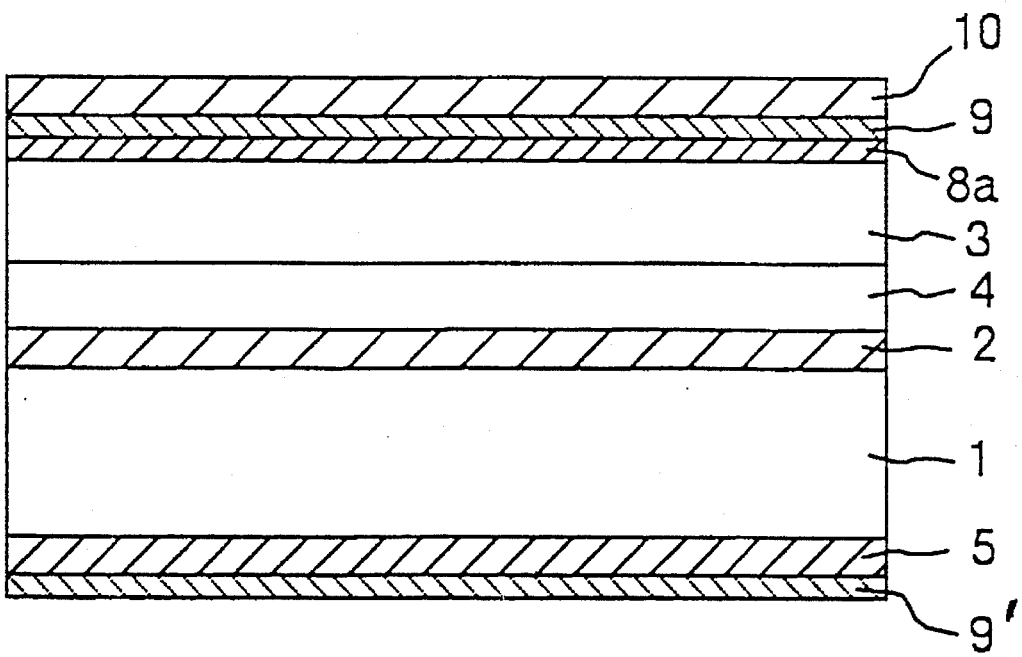
FIG. 2 is a sectional view of a production step of an SOI substrate according to the first embodiment.

Thereafter, pad oxide film 8a is formed by thermal oxidation on the surface of No. 2 silicon substrate 3 side, and further Si₃N₄ film 9 and 9' serving as a No. 1 insulation layer and SiO₂ film 10 serving as a No. 2 insulation layer are sequentially deposited on the surface of pad oxide film 8a by means of chemical vapor deposition. Annealing at 1,000° C. is performed to seal SiO₂ film 10. Next, Si₃N₄ film (i.e., the "silicon nitride film" according to the present invention) 9' which has been deposited on the rear surface of substrate 1 side is removed using a normal etchant (see FIG. 2 and FIG. 3). However, insulation film 5 is allowed to remain. Here, Si₃N₄ film 9 is formed in order to suppress, during etching removal of SiO₂ film 10, etching pad oxide film 8a and the oxide film such as insulation film 13 (described later) or the like, each existing under Si₃N₄ film 9.

Figure 4:
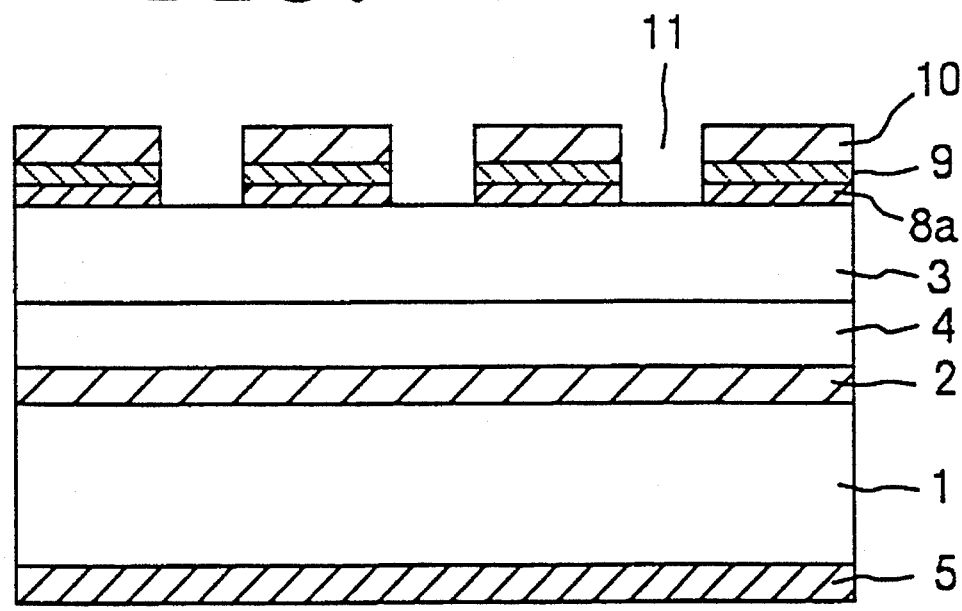
FIG. 4 is a sectional view of a production step of an SOI substrate according to the first embodiment.

Next, a photoresist (not illustrated) is deposited on the surface side. A known photolithographic process and an RIE process employing a gas of CF₄ or CHF₄ series as an etching gas are performed, and SiO₂ film 10 is patterned with the photoresist formed on the surface as a mask. Thereafter, Si₃N₄ film 9 and pad oxide film 8a exposed within an opening formed in SiO₂ film 10 are selectively etched, and opening 11 extending to the surface of silicon substrate 3 is formed (see FIG. 4). Furthermore, FIG. 4 indicates the state after photoresist exfoliation.

Next, SiO₂ film 10 is made to act as a mask and No. 2 silicon substrate 3 is selectively etched by means of an RIE process employing HBr series gas as the etching gas. Here, the deposition thickness of SiO₂ film 10 in the previous step is determined by means of the etching selection rate of SiO₂ film 10 and silicon substrate 3 such that isolation groove (trench) 12 extends to insulation film 2.

Next, chemical dry etching (CDE) processing is performed on the inner walls of isolation trench 12. This CDE process employs an RF-discharge type plasma etching device and is performed at conditions of, for example, raw material gas: CF₄, O₂, and N₂; frequency: 13.56 MHz; etching speed: 1,500 Å/min.; and distance from plasma to wafer: 100 cm. By means of this, the inner walls of isolation trench 12 are etched approximately 1,500 Å.

Next, the inner walls of isolation trench 12 which have been CDE-processed are annealed. This annealing is performed by means of heating for 30 minutes at 1,000° C. in, for example, a nitrogen atmosphere.

Next, it is acceptable to perform a sacrificial oxidation process for the inner walls of annealed isolation trench 12. This sacrificial oxidation process is made to form a sacrificial oxide film of 500 Å by means of, for example, dry oxidation at 1,000° C., after which this sacrificial oxide film is removed with hydrofluoric acid.

Thereafter, insulation film 13 is formed on the inner walls of isolation trench 12 by means of, for example, wet thermal oxidation at 1,050° C., and next polycrystalline silicon 14, in isolation trench 12 between insulation film 13 disposed on facing trench walls, is deposited by means of a low-pressure chemical vapor deposition (LP-CVD) method. At this time, polycrystalline silicon 14 is buried within isolation trench 12 and is also made to be deposited on SiO₂ film 10 and on insulation film 5 on the rear surface side (see FIG. 5).

Next, by means of a dry etching process, excess polycrystalline silicon 14 deposited on SiO₂ film 10 is etched back (one time) by means of dry etching. At this time, etching is made to be stopped so that an upper end of polycrystalline silicon 14 remaining within isolation trench 12 is higher than Si₃N₄ film 9.

Then, SiO₂ film 10 is etched away by means of a wet etching process with a hydrofluoric acid solution. Si₃N₄ film 9 and polycrystalline silicon 14 allowed to remain such that an upper end of polycrystalline silicon 14 is higher than Si₃N₄ film 9, thus becoming an etching stopper. Pad oxide film 8a and insulation film 13 formed on the inner walls of isolation trench 12 are not etched.

Next, the portion of polycrystalline silicon 14 buried in isolation trench 12 which protrudes higher than Si₃N₄ film 9 is etched back (two times) by means of a dry etching process. At this time, it is preferable to control the etching so that the upper end of polycrystalline silicon 14 is about 0.3 μm lower than an upper end of pad oxide film 8a, so that thermal oxide film 15 (to be described later) and surrounding pad oxide film 8a an identical height when thermal oxide film 15 is formed on an upper side of polycrystalline silicon 14 disposed in isolation trench 12 in a subsequent step.

Figure 6:
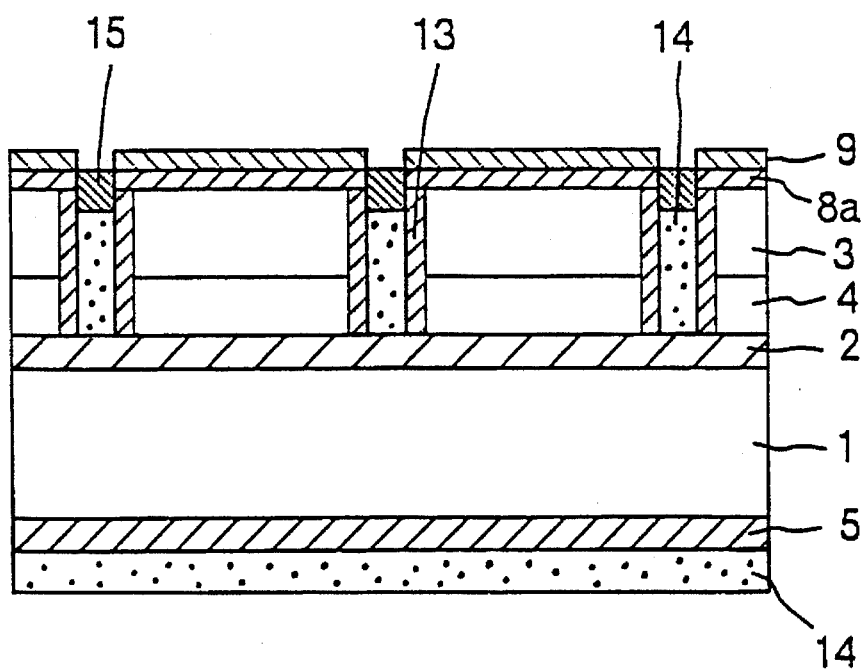
FIG. 6 is a sectional view of a production step of an SOI substrate according to the first embodiment.

Next, an upper portion of polycrystalline silicon 14 buried in isolation trench 12 is thermally oxidized locally from $Si_3N_4$ film 9 and oxide film 15 is formed (see FIG. 6). Thereafter, $Si_3N_4$ film 9 is etched away (see FIG. 7). As is clear from FIG. 7, the difference in level in isolation trench 12 portion is reduced, thus leaving the top of oxide film 15 at substantially the same height as pad oxide film 8a.

Accordingly, P well region 6 and an N well region (not illustrated) are formed on No. 2 semiconductor substrate 3 side by means of known photolithographic and doping diffusion steps. Thereafter, field oxide film 8 is formed on the surface of No. 2 semiconductor substrate 3 side by means of a LOCOS (local oxidation of silicon) method. The LOCOS method re-forms a $Si_3N_4$ film as an oxide-prevention film at a specified location on the substrate surface, after which the location where the $Si_3N_4$ film has not been formed is oxidized by means of thermal oxidation or the like to form thick field oxide film 8. After oxidation by the LOCOS method, the foregoing $Si_3N_4$ film is removed by means of $H_3PO_4$.

Figure 8:
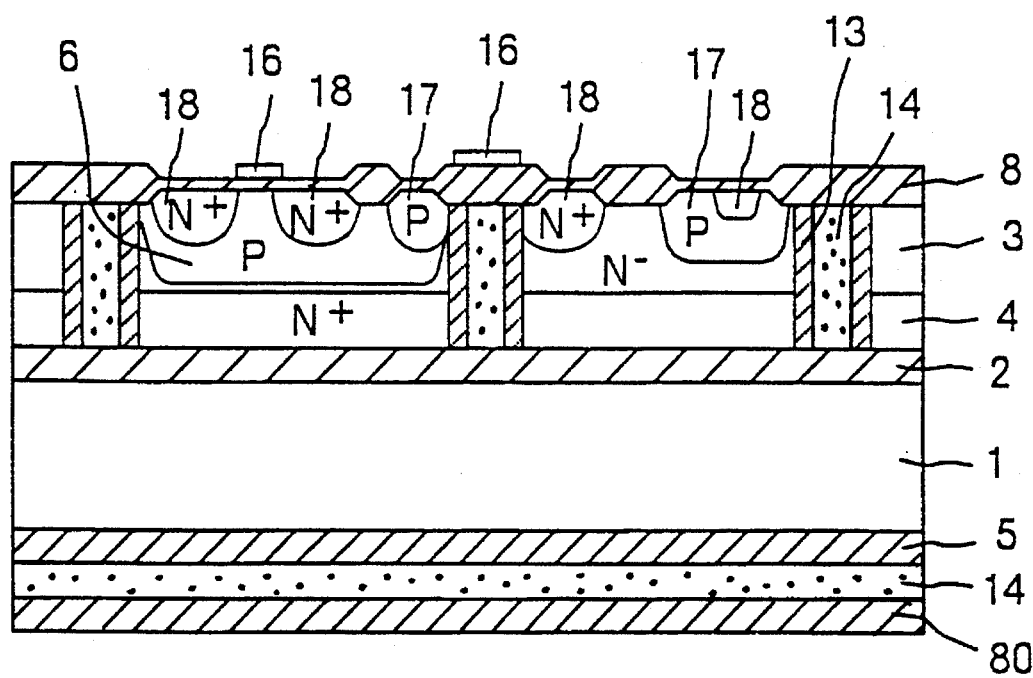
FIG. 8 is a sectional view of a production step of an SOI substrate according to the first embodiment.

At the time of oxidation by means of the LOCOS method (in a case wherein a field oxide film is formed without performing LOCOS oxidation, at the time of formation of this field oxide film), the surface portion of polycrystalline silicon layer 14 on the rear surface is oxidized and becomes silicon oxide film 80 (see FIG. 8).

By simultaneously oxidizing the polycrystalline silicon of the rear surface during formation of the LOCOS oxide film to form oxide film 80 in this manner, a thick film is simultaneously formed on the outer side of insulation films 2 and 5 formed on the two sides of monocrystalline silicon substrate 1. Consequently, the stress balance of the front and rear surfaces of the substrate is equalized.

Furthermore, if the thicknesses of the respective layers are considered, silicon substrate 1 is roughly 600 μm and insulation films 2 and 5 are 1 μm, the thickness of silicon substrate 3 side including high-concentration layer 4 is roughly 15 μm, the polycrystalline silicon layer deposited on insulation film 5 is 4 μm, and LOCOS oxide film 8 and polycrystalline silicon oxide film 80 on the rear surface are roughly 1 μm. By disposing insulation films 2 and 5, semiconductor layers 3, 4, and 14, oxide films 8 and 80 on the rear surface symmetrically with respect to the silicon substrate 1, a semiconductor device with balanced stress is formed.

Next, after removal of pad oxide film 8a, a thin gate oxide film is formed, a polycrystalline silicon lead (gate electrode) 16 is formed by means of an LP-CVD process as well as photolithographic and etching processes, and moreover, P+diffusion layer 17 and N+ diffusion layer 18 are formed by means of local doping.

Subsequently, an interlayer insulation film (not illustrated) of PSG, BPSG, or the like is deposited, an aluminum lead (not illustrated) is provided, a protective film (not illustrated) composed of nitride film or the like is formed by means of plasma chemical vapor deposition, and a Bi-CMOS semiconductor device integrating a CMOS transistor and bipolar transistor is produced (see FIG. 8).

The mode of operation and effects of a device according to the present embodiment will be described.

Figure 3:
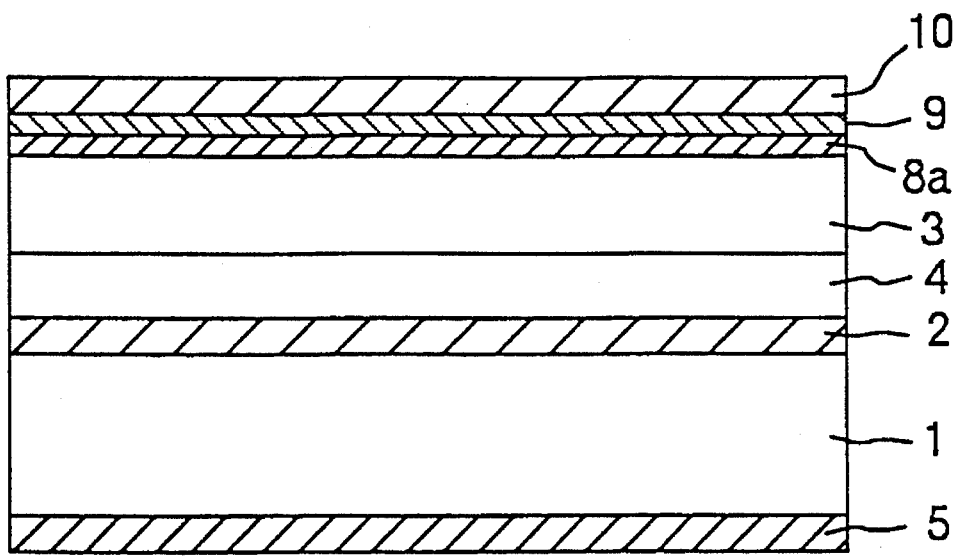
FIG. 3 is a sectional view of a production step of an SOI substrate according to the first embodiment.

As was described above, a step to remove $Si_3N_4$ film 9 accumulated on the rear surface side has been added (see FIG. 3). Conventionally, $Si_3N_4$ film 9 covered insulation film 5, and active removal was not performed because of the expectation of being able to protect from the penetration of undesirable contaminants.

Figure 9:
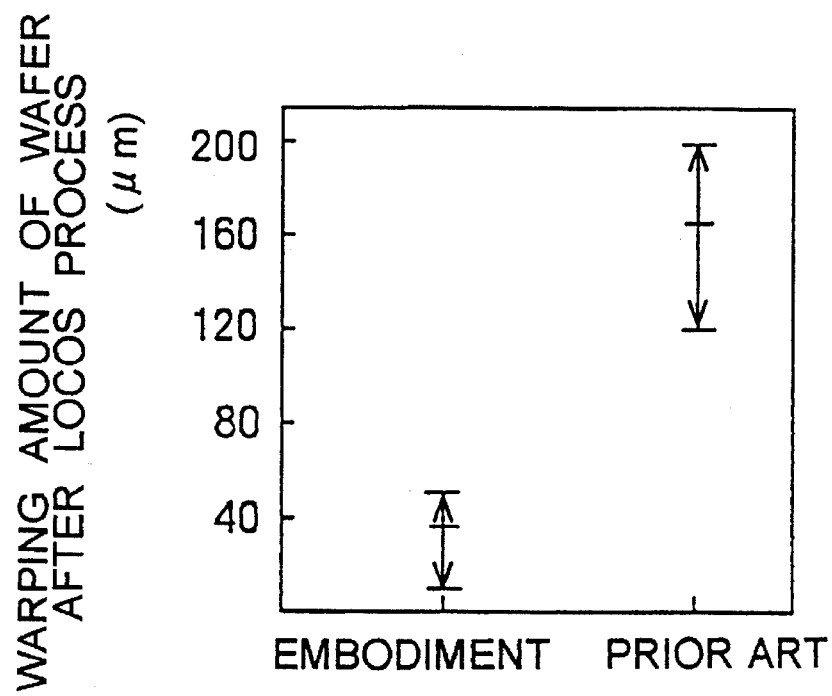
FIG. 9 indicates the results of testing of amount an warpage of an article according to the first embodiment and an article according to the prior art.

However, it was understood that warpage of substrate 1 could be vastly reduced by removal of $Si_3N_4$ film 9 on the rear surface side. FIG. 9 indicates testing results.

A commercial flatness tester was employed to measure the respective amounts of warpage of 20 articles according to the present embodiment and 20 articles according to the prior art having $Si_3N_4$ film 9 and formed by otherwise identical steps.

For the articles according to the present embodiment the maximum amount of warpage was 50 μm, the minimum amount of warpage was 20 μm, and the average amount of warpage was 40 μm. In contrast to this, for the articles according to the prior art, the maximum amount of warpage was 200 μm, the minimum amount of warpage was 120 μm, and the average amount of warpage was 165 μm. Consequently, it is understood that the amount of warpage can be simply and significantly reduced by means of the present embodiment.

When manufactured in this manner, insulation films 2 and 5 of identical film thickness and identical density are produced on the two sides of substrate 1. Further, oxide films 8 and 80 are produced by means of LOCOS oxidation. Because stress due to the difference in the thermal expansion rates between insulation films 2, 5, 8, and 80 and substrate 1 is equal, warpage is greatly reduced.

The significance of employing $Si_3N_4$ film 9 will be described next.

According to the method of production of the present embodiment, during etching of $SiO_2$ film 10 in isolation trench 12 portion, the advance of etching pad oxide film 8a or insulation film 13 or the like existing in a layer thereunder is prevented by means of $Si_3N_4$ film 9 and polycrystalline silicon 14. Consequently, because a flat configuration is obtained with no formation of a difference in level in isolation trench 12 portion, problems such as uneven breakage or shorting of polycrystalline silicon lead 16 or an aluminum lead can be solved.

Another embodiment of the present invention is described with reference to FIGS. 10 and 11.

Figure 5:
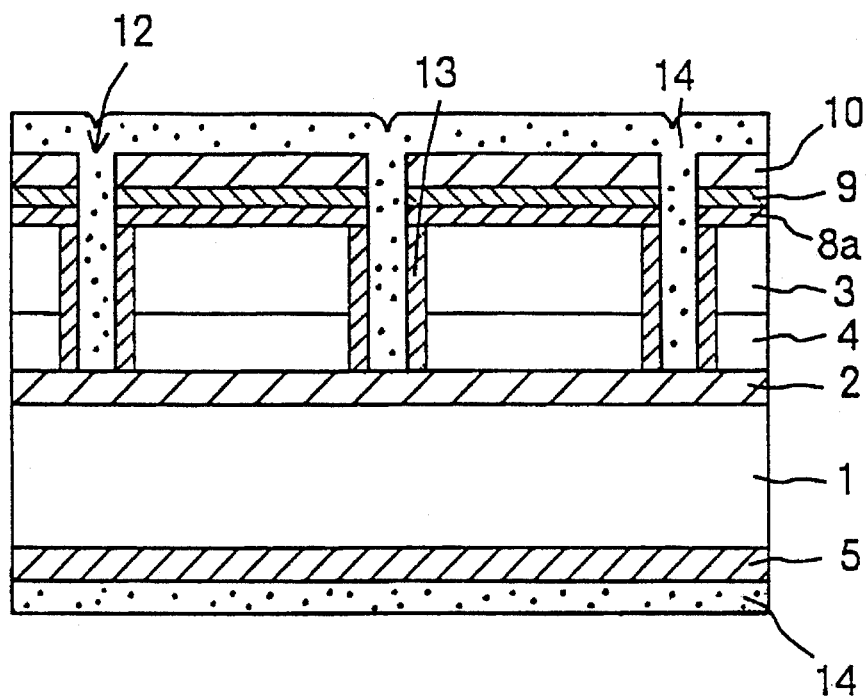
FIG. 5 is a sectional view of a production step of an SOI substrate according to the first embodiment.

The second embodiment is identical to the first embodiment from the step indicated in FIG. 5 to the first etch-back of the polycrystalline silicon. At this time, an upper end of the polycrystalline silicon 14 remaining within isolation trench 12 protrudes higher than $Si_3N_4$ film 9.

Figure 10:
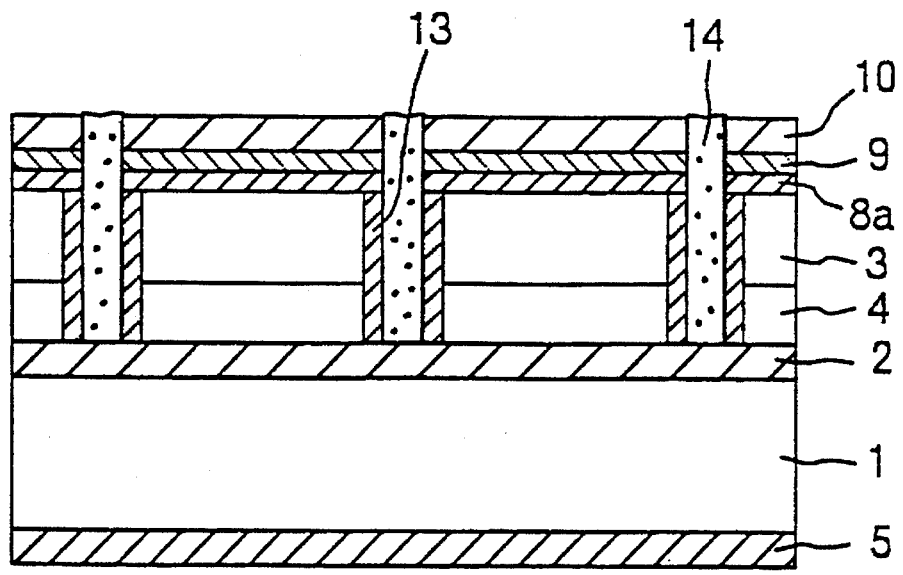
FIG. 10 is a sectional view of a production step of an SOI substrate according to a second embodiment of the present invention.

Next, excess polycrystalline silicon 14 deposited on insulation film 5 on the rear surface is removed by means of dry etching (see FIG. 10). This is the point of difference with the above-described first embodiment. Additionally, it is also acceptable that this removal of polycrystalline silicon 14 on the rear surface side be removal by means of dry etching after etching silicon oxide film 10.

Figure 7:
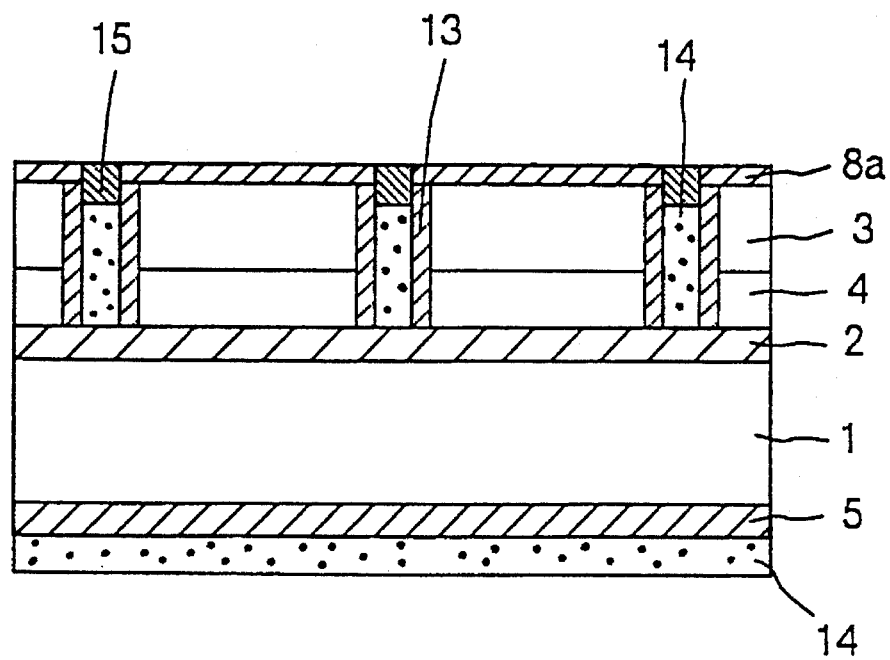
FIG. 7 is a sectional view of a production step of an SOI substrate according to the first embodiment.
Figure 11:
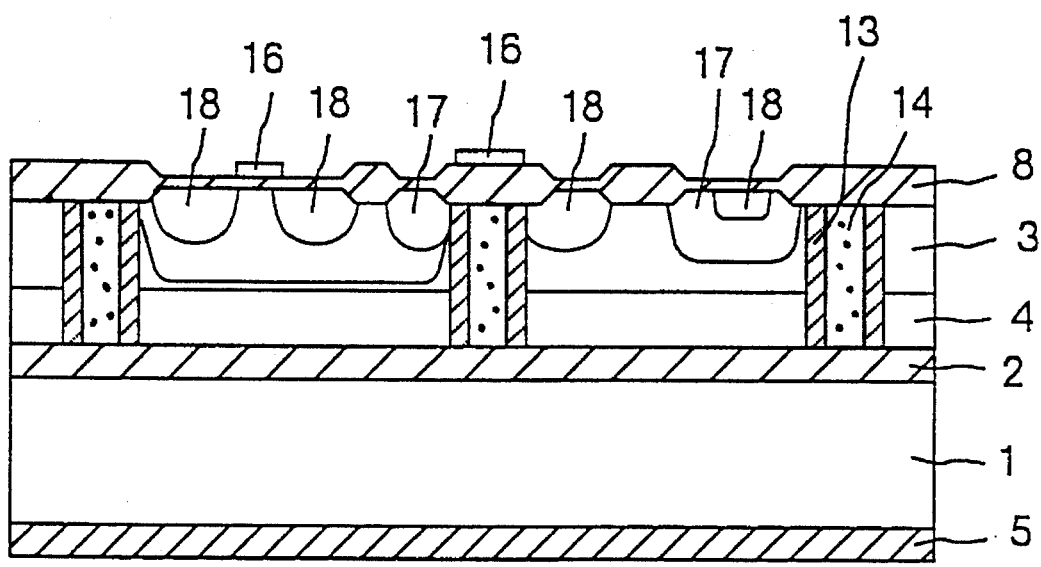
FIG. 11 is a sectional view of a production step of an SOI substrate according to the second embodiment.

Subsequently, steps identical with the first embodiment indicated in FIG. 6 and FIG. 7 are passed through to form semiconductor elements on the substrate 3 side as shown in FIG. 11. In addition, according to the present embodiment, at the time of the above-described element formation in FIG. 8, insulation film 5 on the rear surface assumes an exposed state at the time of oxidation by means of a LOCOS method (in a case wherein a field oxide film is formed without performing LOCOS oxidation, at the time of formation of this field oxide film).

According to the present embodiment, there exists a step to remove $Si_3N_4$ film 9 accumulated on the rear surface side, and moreover a step to remove polycrystalline silicon 14 accumulated on the rear surface side is added (see FIG. 10). Warpage of the substrate can be reduced when this is done.

The present invention has been shown and described in connection with what are considered the presently preferred embodiments. However, this invention is not meant to be limited thereto. Rather, all modifications and equivalent arrangements included within the spirit and scope of the appended claims are intended to be encompassed by the present invention.

What is claimed is:

1. A method of producing an SOI semiconductor device comprising the steps of:

joining a semiconductor substrate serving as a base and having a main surface and a junction surface opposite said main surface to a semiconductor layer, wherein an inner insulation film is sandwiched between said junction surface of said semiconductor substrate and said semiconductor layer and an outer insulation film is provided on said main surface of said semiconductor substrate;

forming a first nitride film as a mask for trench formation over an exposed surface of said semiconductor layer;

removing a second nitride film which has accumulated on said outer insulation film and which accumulated on said outer insulation film during said first nitride film forming step;

using said first nitride film over said semiconductor layer as said mask in forming a trench in said semiconductor layer; and filling in said trench with a filler material to form an island semiconductor region.

2. The method of producing an SOI semiconductor device according to claim 1, further comprising the steps of:

removing said filler material which has accumulated over said outer insulation film and which accumulated during said filling in step; and forming elements in said island semiconductor region.

3. The method of producing an SOI semiconductor device according to claim 1, further including the step of: forming said outer insulation film and said inner insulation film from silicon oxide and so that said outer insulation film and said inner insulation film have identical thicknesses.

4. The method of producing an SOI semiconductor device according to claim 3, wherein the forming of the output and inner insulation films from silicon oxide includes the step, prior to said joining step, of simultaneously forming silicon oxide films over said main surface and said junction surface of said semiconductor substrate, said silicon oxide films serving as said outer insulation film and said inner insulation film, respectively.

5. The method of producing and SOI semiconductor device according to claim 1, further comprising the steps of: forming a field oxide film over a surface of said semiconductor layer, while simultaneously oxidizing a surface of said filler material which has accumulated on said outer insulation film during said filling in step.

6. A method of forming an SOI semiconductor device, said method comprising the steps of:

forming a first insulation film on a first side of a substrate and a second insulation film on a second side of said substrate;

bonding a semiconductor layer to said substrate so as to sandwich said first insulation film therebetween;

forming a first nitride film over a surface of said semiconductor layer opposite said first insulation film;

removing a second nitride film which has been deposited on said second insulation film and which has been deposited during said first nitride film forming step;

forming a trench in said semiconductor layer using said first nitride film disposed over said surface of semiconductor layer opposite said first insulation film as a mask;

filling in said trench with a filler material; and forming in said semiconductor layer an island-like semiconductor region in which a semiconductor element is formed.

* * * * *